(12) United States Patent
Liu

(10) Patent No.: US 9,077,348 B1
(45) Date of Patent: Jul. 7, 2015

(54) FRACTIONAL CLOCK GENERATOR

(75) Inventor: Haichen Liu, Plano, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 74 days.

(21) Appl. No.: 13/617,903

(22) Filed: Sep. 14, 2012

(51) Int. Cl.
*H03B 19/00* (2006.01)
*H03L 7/06* (2006.01)

(52) U.S. Cl.
CPC . *H03L 7/06* (2013.01); *H03B 19/00* (2013.01)

(58) Field of Classification Search
USPC .......................................................... 327/117
See application file for complete search history.

(56) References Cited

U.S. PATENT DOCUMENTS

| | | | |
|---|---|---|---|
| 7,417,510 B2 * | 8/2008 | Huang | 331/74 |
| 7,639,053 B2 * | 12/2009 | Shen et al. | 327/158 |
| 7,778,371 B2 * | 8/2010 | Do et al. | 375/371 |
| 2006/0025094 A1 * | 2/2006 | Ozawa et al. | 455/208 |
| 2008/0143403 A1 * | 6/2008 | Huang et al. | 327/158 |
| 2008/0164917 A1 * | 7/2008 | Floyd et al. | 327/117 |
| 2009/0295442 A1 * | 12/2009 | Kwak | 327/158 |
| 2010/0225370 A1 * | 9/2010 | Demone | 327/158 |
| 2012/0092051 A1 * | 4/2012 | Erdogan | 327/158 |
| 2012/0313673 A1 * | 12/2012 | Lin | 327/117 |

OTHER PUBLICATIONS

"Sub-Integer Frequency Synthesis Using Phase-Rotating Frequency Dividers", by Brian A. Floyd. IEEE Transactions on Circuits and Systems—I:Regular Papers, vol. 55, No. 7, Aug. 2008; pp. 1823-1833.
"A 4.75-GHz Fractional Frequency Divider-by-1.25 With TDC-Based All Digital Spur Calibration in 45-nm CMOS", by Pellerano et al. IEEE Journal of Solid State Circuits, vol. 44, No. 12, Dec. 2009; pp. 3422-3433.

* cited by examiner

*Primary Examiner* — Lincoln Donovan
*Assistant Examiner* — Patrick Chen
(74) *Attorney, Agent, or Firm* — North Weber & Baugh LLP

(57) ABSTRACT

Various embodiments of the invention allow the generation of an output clock signal that comprises a frequency that is a fractional frequency of an input clock signal and is adjusted with respect to an input signal. A fractional clock generator that has high performance output, low power consumption, small area, and good jitter performance is presented.

20 Claims, 5 Drawing Sheets

FRACTIONAL CLOCK GENERATOR

BACKGROUND

A. Technical Field

The present invention relates to generating digital clocking schemes, and more particularly, to systems, devices, and methods of generating fractional clock signals by non-integer frequency division.

B. Background of the Invention

A wide variety of modern high-speed communications in digital and mixed-signal circuits require the conversion of a single reference clock signal having a fixed frequency into multiple clock signals having different and typically slower frequencies. Clock frequencies that are integer multiples of each other are oftentimes generated by circuits that combine a phase-locked loop (PLL) and a frequency divider having a fixed integer division ratio to scale from one frequency to another. PLLs compare the output of a voltage controllable oscillator (VCO) to the output of a fixed-frequency reference oscillator and adjust the VCO frequency to that of the reference oscillator. PLLs can output a frequency that is a multiple N of the reference oscillator frequency, in this case, dividing VCO output clock by N before comparing it with the reference oscillator output.

Circuits that generate non-integer ratios are limited to a few non-integer ratios, because complexity increases significantly when clock signal frequencies to be generated are non-integer multiples of each other. Die area and power considerations oftentimes do not allow for the use separate PLLs to generate each clock signal. One existing approach to achieve division by a fraction of an integer combines a single PLL with an input frequency divider and/or a divider in the feedback path to generate clock signal frequencies that are fractional multiples of each other. Other approaches are implemented by using logic circuits with a single PLL and fractional frequency dividers in the feedback path, for example, in frequency synthesizers.

What is needed is a fractional clock generator with a small die area, low power consumption, and a low jitter high performance output.

SUMMARY OF THE INVENTION

Various embodiments of the invention provide for the generation of fractional clock signals. In particular, certain embodiments allow for generating non-integer frequency division with a fractional clock generator that has a high performance output, low power consumption, small area, and good jitter performance.

In certain embodiments of the invention, a phase generator generates, from an input clock signal, multiple same frequency clock signals of varying phases that are input into a multiplexer. A selection circuit coupled to the multiplexer within a feedback loop controls the sequence in which the clock signals are selected by the multiplexer to serve as an output clock signal. Depending on the order of selection, the phase shift between the successively selected clock signals increases or decreases the period of the selected clock signal and, thereby, adjusts the output clock signal frequency with respect to an input signal.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily all referring to the same embodiment.

Furthermore, connections between components or between method steps in the figures are not restricted to connections that are effected directly. Instead, connections illustrated in the figures between components or method steps may be modified or otherwise changed through the addition thereto of intermediary components or method steps, without departing from the teachings of the present invention.

Figure 1:
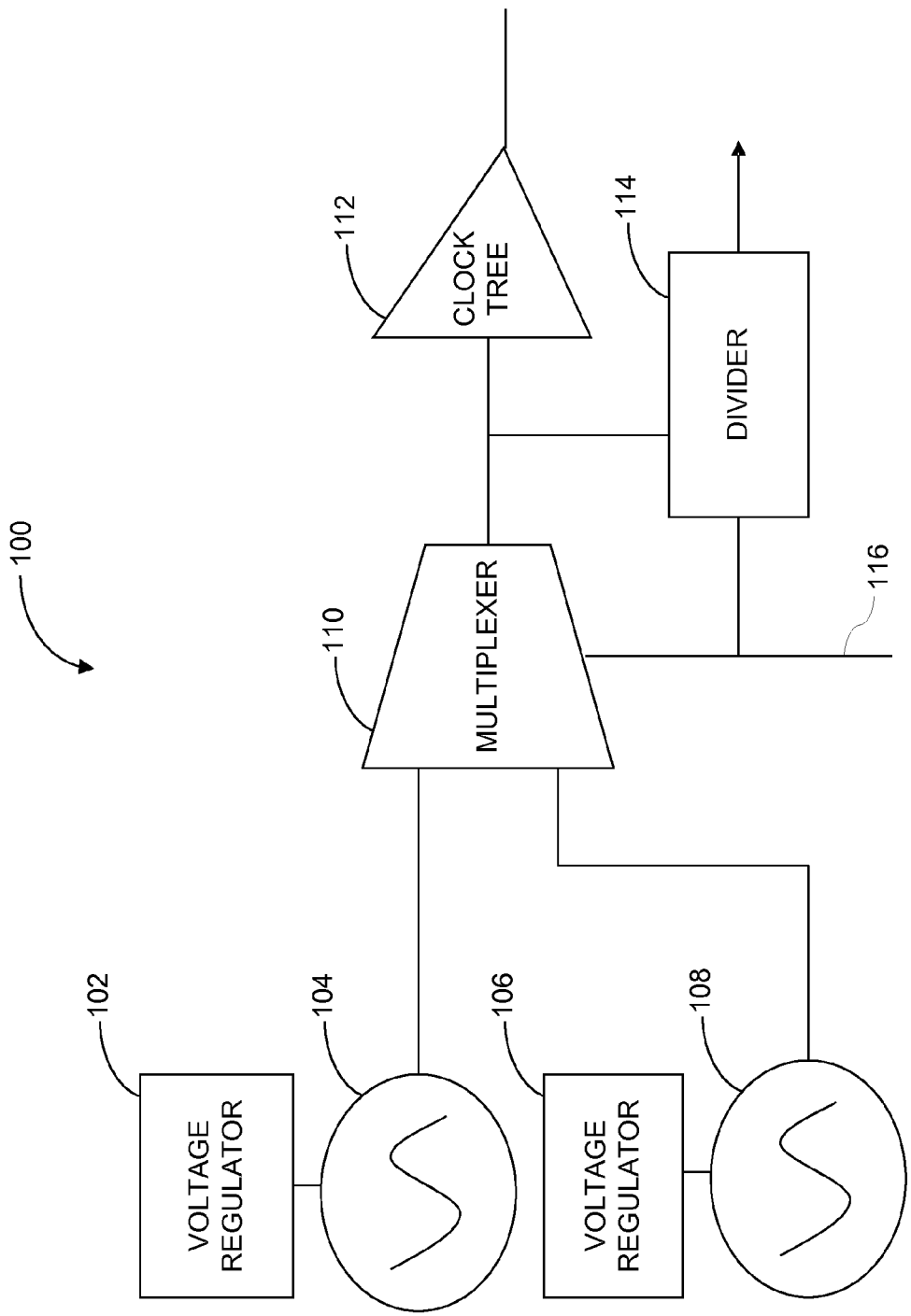
FIG. 1 illustrates a block diagram of a prior art fractional clock generator circuit having two voltage controlled oscillators (VCOs), each VCO operates at one fixed frequency.

FIG. 1 illustrates a block diagram of a prior art fractional clock generator circuit having two voltage controlled oscillators, wherein each VCO operates at one fixed frequency. Voltage regulator 102 provides power to a first VCO circuit 104, and voltage regulator 106 provides power to a second VCO circuit 108, respectively. Each VCO circuit generates a fixed-frequency clock signal. In this example, the first VCO circuit 104 outputs a 8 GHz clock signal and the second VCO circuit 108 outputs a 5 GHz clock signal. Both VCO signals are received by multiplexer 110. The output of multiplexer 110 is passed to one or more frequency dividers 114 coupled in a feedback loop with multiplexer 110. Divider 114 divides the output of multiplexer 110 with different ratios to match the frequency of a reference input clock coupled to the PLLs (not shown). Typical frequency division ratios are, for example, 20, 30, 40, or 80.

Multiplexer 110 also receives from a rate control circuit (not shown) rate select signal 116 that selects one of the two VCO clock signals. Under the direction of the rate select signal 116, multiplexer 110 outputs as the selected clock signal either the 8 GHz clock signal or the 5 GHz clock signal. The output of multiplexer 110 drives clocktree 112 and is routed to a Serializer/Deserializer circuit (not shown) for further processing. Difficulties arise in preserving signal integrity when the 5 GHz and 8 GHz clock signal pass through clock tree 112 because clock tree 112 generally performs optimally only at a single frequency. This approach will also consume significantly more die area die to the extra voltage regulator and VCO. Additional difficulties relate to isolating the electrical coupling between the two VCOs.

Figure 2:
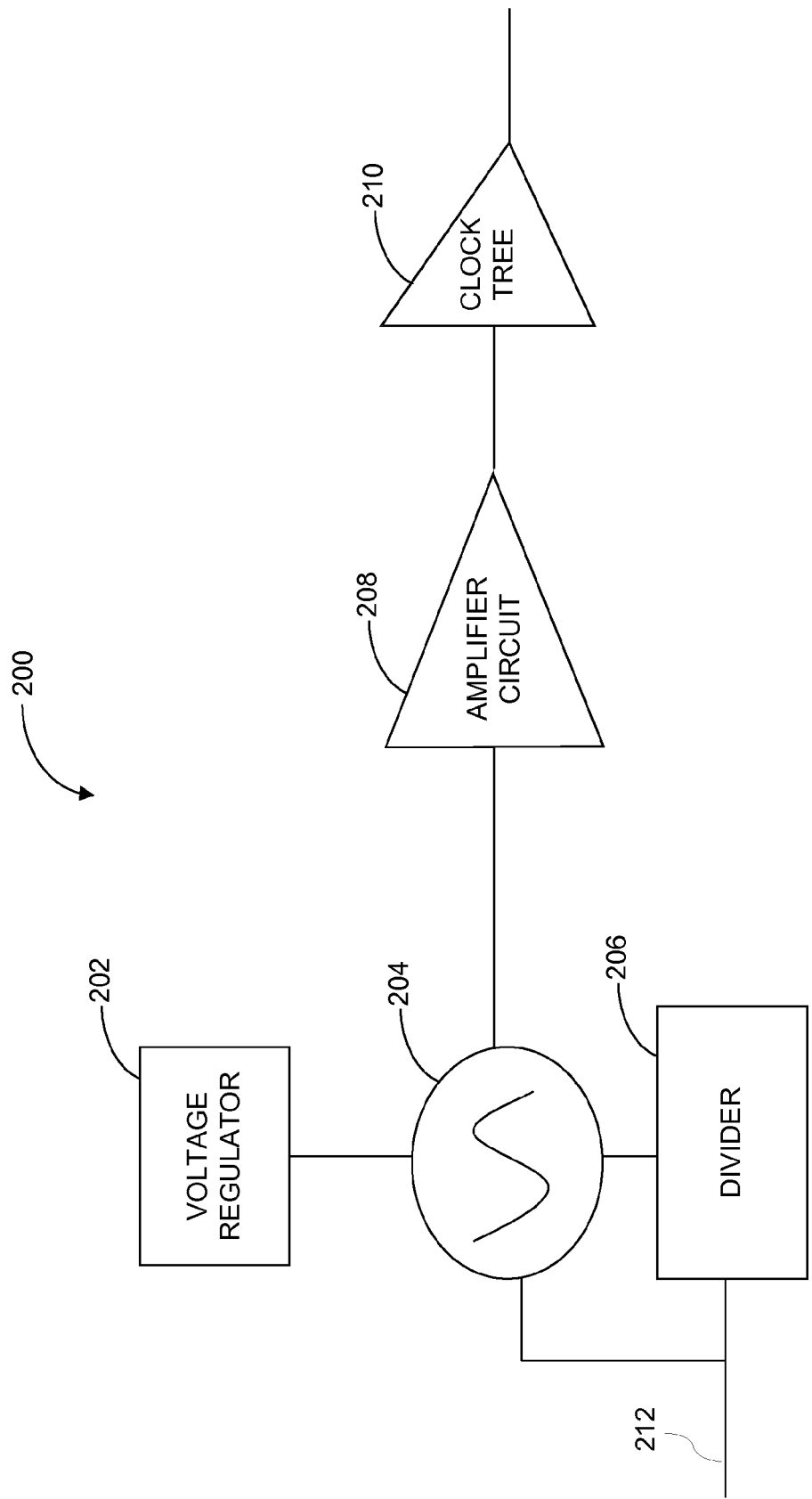
FIG. 2 illustrates a block diagram of a prior art fractional clock generator circuit having one single VCO operating at adjustable frequencies.

FIG. 2 illustrates a block diagram of a prior art fractional clock generator circuit having a single voltage controlled oscillator operating at adjustable frequencies. Voltage regulator 202 provides power to voltage controlled oscillator (VCO) 204. Rate selection signal 212 is input into VCO 204 and into frequency divider 206 to select the output frequency of VCO 204 as either 5 GHz or 8 GHz. The output of VCO circuit 202 is input to one or more frequency dividers 206. Divider 206 divides the multiplexer output with different ratios to match the frequency of the reference input clock to the PLLs (not shown). As in the circuit of FIG. 1, the frequency division ratio may be 20, 30, 40, 80, etc.

The output of VCO circuit 204 is input to buffer amplifier circuit 208 and is passed to clock tree 210. Buffer amplifier circuit 208 receives the clock signal output from VCO circuit 202 and buffers the clock signal to drive clock tree 210. Clock tree 210 then routes the clock signal to a Serializer/Deserializer circuit or any subset of circuits that may require the 5 GHz or the 8 GHz clocking signal.

The circuit of FIG. 2 generates multiple operating frequencies by adjusting rate select signals 216 feeding into VCO 204. In addition to the extra effort necessary to solve the challenge design issue, more components need be added into VCO 204 to operate in the multi-Gigahertz range. Such circuits are inherently susceptible to high noise, which results in increased jitter in the output clock signals. Another major drawback of this circuit is that changes between operating frequencies tend to require time-consuming frequency re-locking within VCO 204. Similar difficulties as in the circuit of FIG. 1 arise in preserving signal integrity when the 5 GHz and 8 GHz clock signal pass through clock tree 210, since clock tree 210 generally performs optimally only at a single frequency.

Figure 3:
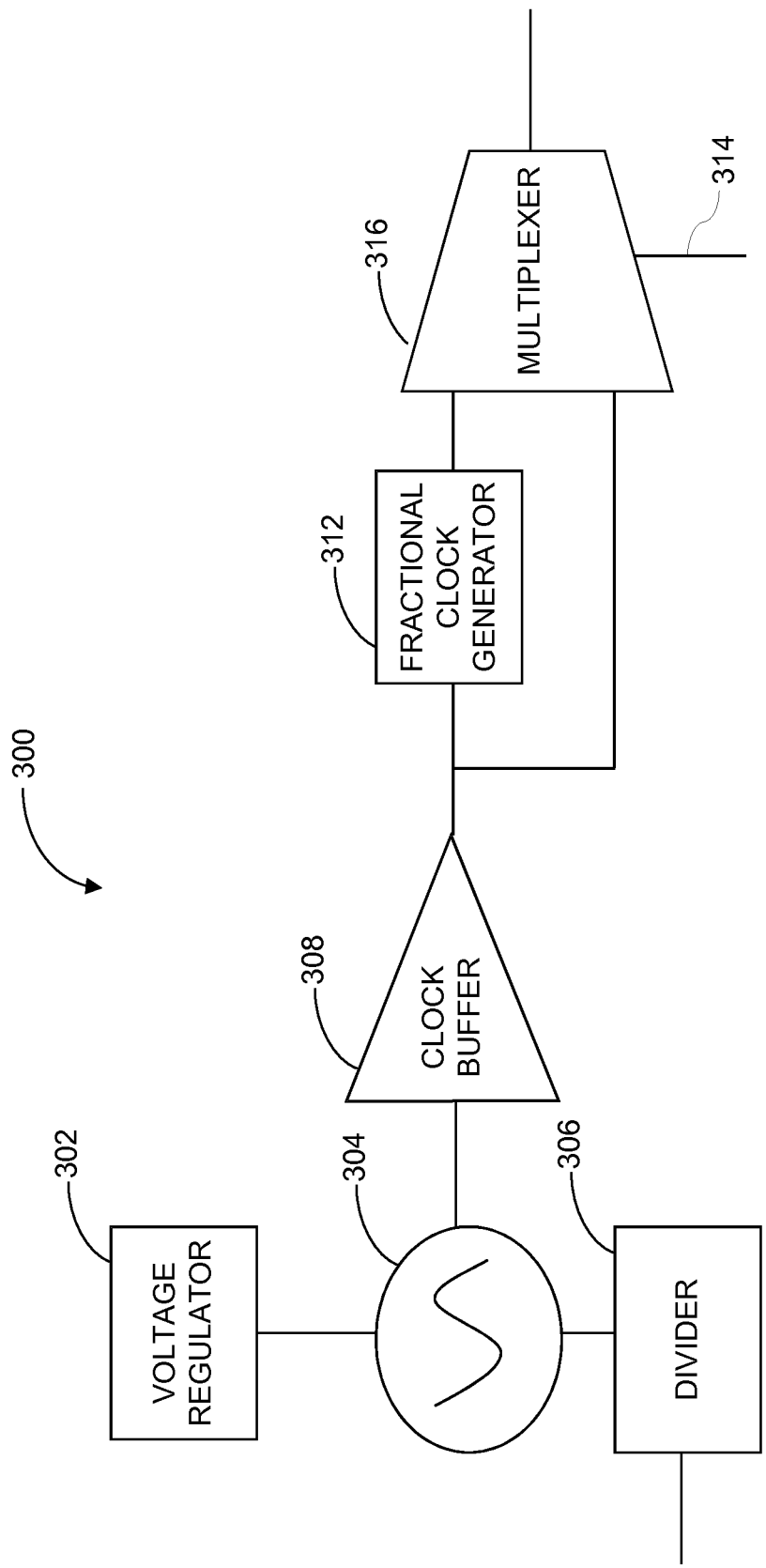
FIG. 3 illustrates a block diagram of a fractional clock generator using a sinble VCO operating at a fixed frequency and a clock divider, according to various embodiments of the invention.

FIG. 3 illustrates a block diagram of a fractional clock generator using a single VCO operating at a fixed frequency, according to various embodiments of the invention. Voltage regulator 302 provides power to VCO 304. The output of VCO circuit 304 is input to one or more frequency dividers 306. Divider 306 divides the output of VCO 304 with different ratios to match the frequency of the reference input clock (not shown). The input of clock buffer 308 is coupled to the output of VCO 304, the output of clock buffer 308 is coupled to fractional clock generator 312 that can generate a plurality of frequency clock signals. For example, fractional clock generator 312 may divide 8 GHz by a factor of 1.6 to generate a 5 GHz output signal that is fed into multiplexer 316. Input signal 314 may select either the output frequency of fractional clock generator 312 (5 GHz) or the input frequency of fractional clock generator 312 (8 GHz) as the output frequency of multiplexer 316.

Figure 4:
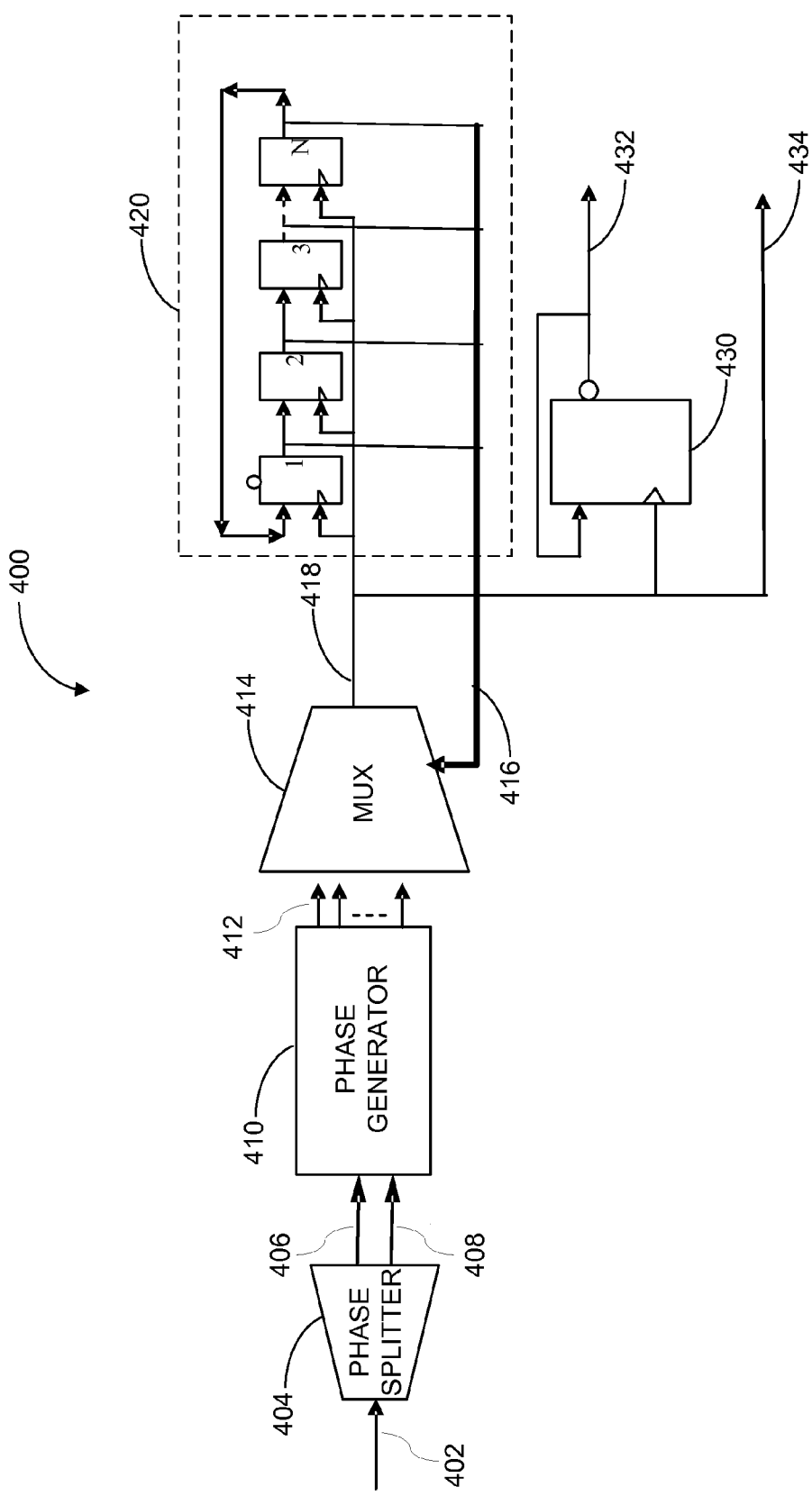
FIG. 4 illustrates a fractional clock generator according to various embodiments of the invention.

FIG. 4 illustrates a fractional clock generator according to various embodiments of. Phase splitter 404 receives input clock signal 402 and generates signals 406 and 408 of equal amplitude. Signals 406 and 408 are 90° out of phase with respect to each other at the input frequency of input clock signal 402. Phase splitter 404 may be implemented, for example, as a differential RC phase splitter. Phase generator 410 receives signals 406 and 408 and, at its output 412, generates N clock signals of the same frequency as input clock signal 402, wherein N is an integer number equal to or greater than 1. The N clock signals are inputs to phase multiplexer 414 which may be an N to 1 multiplexer that has an additional input coupled to receive feedback signal 416 from one hot state machine 420. One hot state machine 420 generates feedback signal 416 in response to output clock signal 418. Additionally, optional latch circuit 430 may be coupled to receive output clock signal 418 and divide the frequency of output clock signal 418 by a predetermined divider ratio. For example, as shown in FIG. 4, optional latch circuit 430 may be a divide-by-two circuit.

In one embodiment, the phase angle of phase signal 406 generated by phase splitter 404 is 0° and the phase angle of phase signal 408 is offset by 90°. Differential phase signals 406 and 408 may be generated using a simple RC series circuit, wherein the voltage across a capacitor lags the current and voltage across a resistor by a phase angle of 90°. Phase signals 406 and 408 may be amplitude matched prior to entering phase generator 410. Phase splitter 404 may generate other same frequency signals that are phase separated by 90°, such as 180° and 270°. Because these are differential signals, when 0° and 90° are generated, 180° and 270° are also generated.

Phase generator 410 may be implemented by a CML differential logic circuit. Phase generator 410 receives phase signals 406 and 408, mixes the signals with different weights to produce a plurality of N clock signals 412, and applies them to phase multiplexer 414. Clock signals 412 are evenly spaced apart in increments of 360/N° phase steps, where N is an integer number representing the number of total clock signals 412 generated by phase generator 410. The positive edge of each clock signal 412 is 360°/N degrees apart from the positive edge of the immediately following clock signal 412. After the Nth clock signal 412 is generated, the cycle begins again with the first clock signal 412. For example, if N equals 5, phase generator 410 generates five clock signals 412, each being 72° offset from a subsequent clock signal 412. After the fifth clock signal 412 is generated, the full cycle begins again with the first clock signal 412. If implemented with CML logic, the weights of phase signal 406 and phase signal 408 are controlled by adjusting their respective tail currents.

Phase multiplexer 414 sequentially selects one of the N clock signals to serve as output clock signal 418. The sequence in which the N clock signals are selected is controlled by one hot state machine 420 via feedback signal 416 that is fed back to phase multiplexer 414. Output clock signal 418 of phase multiplexer 414 comprises a frequency that may be a fractional frequency of input clock signal 402. The overall frequency of output clock signal 418 is determined by the sequence of clock signals 412 that are selected in response to feedback signal 416. In addition, by sequentially selecting clock signals 412, each having a different phase, the frequency of output clock signal 418 can be set higher or lower, resulting in an output/input ratio of frequencies greater or less than 1, respectively.

In some embodiments that require a 50 percent duty cycle, such as for use in switched capacitor networks, output clock signal 418 is divided by a factor of two by a latch or a divider. For example, if the frequency of input clock signal 402 is 8 GHz, but an output frequency of 5 GHz is desired, first, output clock signal 418 is chosen to generate a relatively higher frequency signal, here 10 GHz, then, a latch 430 may be used as an integer frequency divider to divide the 10 GHz frequency signal in half to generate the desired 5 GHz signal, such that clock signal 432 has half the frequency of clock signal 434 and a 50 percent duty cycle.

In some applications where a particular duty cycle is not required and, therefore, no control of/clocking on the negative edges of output clock signal 418 is required, one hot state machine 420 may chose the frequency of output clock signal 418 directly to be 5 GHz by choosing an appropriate sequence of clock signals 412.

One hot state machine 420 is coupled in a feedback loop with phase multiplexer 414 and may be implemented, for example, as a firmware programmed microcontroller, a phase rotator, or a digital state machine. One hot state machine 420 may be formed of serial flip-flop circuit elements coupled to each other in a loop configuration, preferably in close proximity to each other, such that the data output of each preceding flip-flop is coupled to the data input of a following flip-flop to generate a sequence of output signals each of which represents a machine state.

In one embodiment, flip-flops are coupled to be clocked by positive or negative clock edges of output clock signal 418. One hot state machine 420 operates as a phase selecting circuit that comprises N states and advances one state at a time to control the sequence in which phase multiplexer 414 selects one of the N clock signals at a time. Each state may be associated with one of the N clock signals. During any given period, only one of the N states of one hot state machine 420 is a logic one representing a selected state; all other states are set to a logic zero. One hot state machine 420 communicates the selected state to phase multiplexer 414 via feedback signal 416. In response, phase multiplexer 414 selects and outputs one of the N clock signals.

Once the one hot state machine 420 advances from its initial state to its next state in one direction, the transition causes the phase of the selected clock signal to lag with respect the previous selected phase clock signal by an amount given in degrees, for example, 72°. Each subsequent transition causes the phase of the selected clock signal to lag by an increment of 72° until, after five transitions, the state machine rotates back to its initial state and begins the full cycle anew. The selection rotates from the first phase around one hot state machine 420 until the phase goes through a full cycle to re-align with the first phase. The increasing relative phase shift increases the period of the selected clock signal and causes the frequency of the resulting output clock signal 418 to be lower than the frequency of input clock signal 402.

If the one hot state machine 420 advances from its initial state to its next state in the opposite direction, the phase of the selected clock leads with respect to the previous selected phase clock by 72°. Each subsequent state transition causes the period of the selected clock to lead by an increment of 72° until, after another five transitions, the state machine rotates to its initial state to restart the cycle. The leading phase states cause the resulting frequency of output clock signal 412 to be higher than the frequency of input clock signal 402.

One skilled in the art will recognize that any combination of successive machine states and phase states may be selected to generate an output frequency that is higher or lower than the frequency of input clock signal 402, and that the resulting frequency ratio may be any fraction of the frequency of input clock signal 402.

In one embodiment, a control block (not shown) may be coupled between hot state machine 420 and phase multiplexer 414. The control block enables the switching order of clock signals 412. By appropriately selecting and deselecting clock signals 412 a wide range of output frequencies may be covered. By adding a control block, a dynamic change of output clock frequency 418 can be achieved. An appropriate switching algorithm also enables spread spectrum modulation that can be used to generate a desired envelope that complies with certain standards widely used in data and telephone communication systems.

Figure 5:
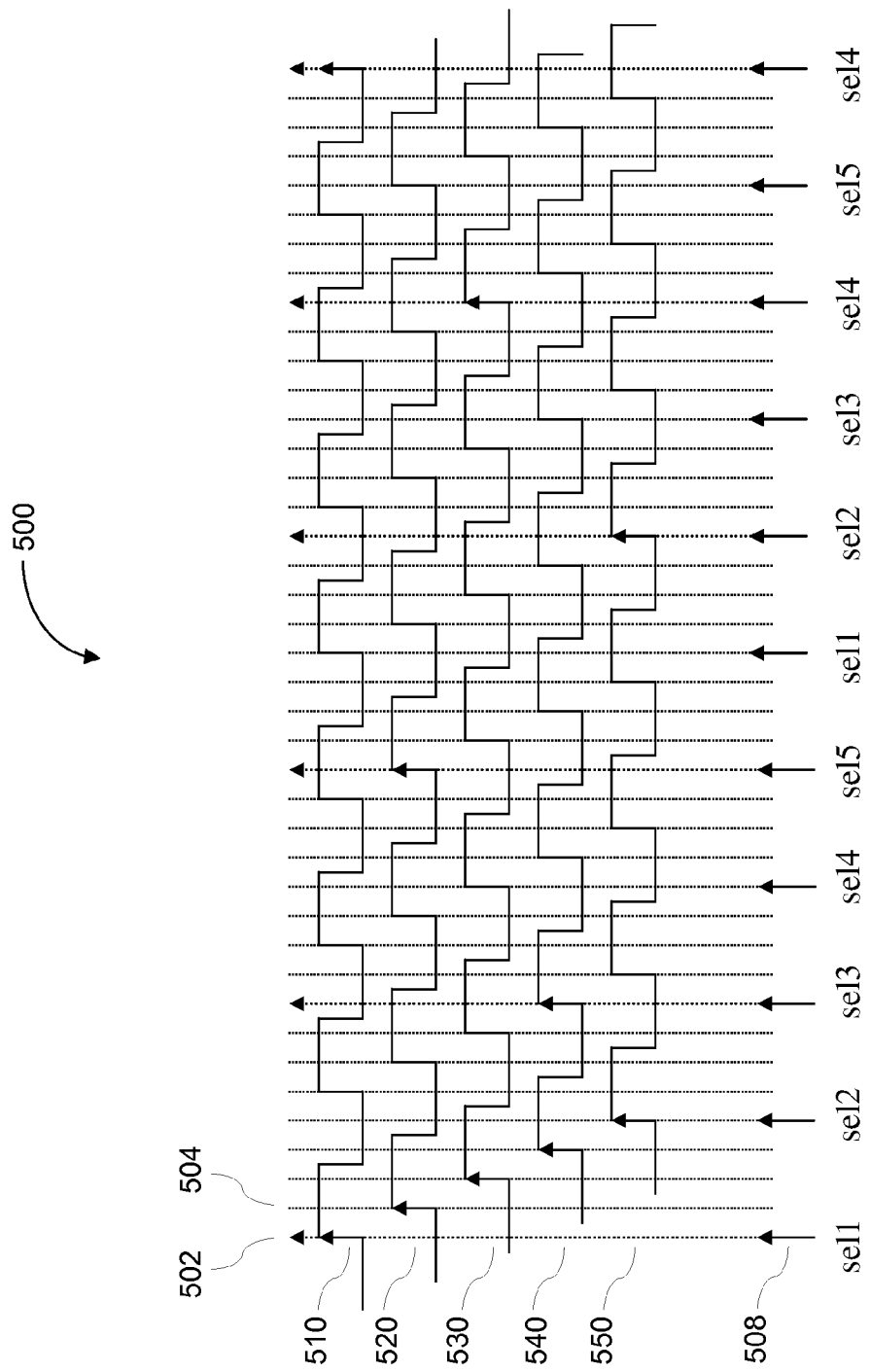
FIG. 5 illustrates a timing diagram of the fractional clock generator of FIG. 4.

FIG. 5 illustrates a timing diagram of the fractional clock generator of FIG. 4. Five clock signals 510-550, unaffected by signal jitter and other distorting effects are shown. Waveforms of clocks signals 510-550 are plotted as having the same period, i.e. they operate at the same frequency. However, each of five clock signals 510-550 has a different phase from each other. The phase shift between two adjacent clocks is ⅕ of the clock period of the input clock signal. Since clock signal 510 begins a 0° 502, clock signal 520 lags clock signal 510 by 72° 504, and clock signal 530 lags clock signal 520 by 72° and clock signal 510 by 144°, etc.

Selections made by the one state machine are labeled sel1, sel2, etc. Arrows 508 point to the positive edge of the currently selected waveform, indicating a transition from one state to the next state that carries the logic one. Each transition triggers the multiplexer to select the next clock signal having the positive edge of the corresponding waveform, which causes the output clock to switch phases. If the phases of the selected clock signal successively lag that of the previously selected clock signal, the output clock signal frequency will be less than that of the input clock signal. Conversely, if the phases of the selected clock signal successively lead that of the input clock, the output clock signal frequency will be higher.

In this example, waveform 510 is selected first, waveform 550, which leads waveform 510 by 72°, is selected second, and waveform 540, which leads waveform 550 by 72°, is selected third, etc., such that the overall period of the output clock signal is shortened by 72° relative to waveform 510 that began at 0°, thereby, increasing the output clock frequency by 25% from 8 GHz to 10 GHz.

If an output clock frequency of 5 GHz is desired, the 10 GHz output clock frequency could be divided by two, as previously discussed. As one alternative, one state machine could select the waveforms in FIG. 5 in the following order: sel1, sel3, sel5, sel2, and sel 4, such that the phase shift between selections increases by a factor of 1.6 equivalent to 216° or reduces in frequency from 8 GHz to 5 GHz.

It will be appreciated to those skilled in the art that the preceding examples and embodiments are exemplary and are for the purposes of clarity and understanding and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention. It is, therefore, intended that the claims in the future non-provisional application will include all such modifications, permutation and equivalents as fall within the true spirit and scope of the present invention.

I claim:
1. A fractional clock generator comprising:
a phase splitter that generates phase signals from an input clock signal having a first frequency;
a phase generator coupled to receive the phase signals and output a plurality of clock signals of the first frequency, each of the plurality of clock signals comprises has a different phase angle;

a phase multiplexer coupled to the phase generator, the phase multiplexer selects a predetermined sequence of the plurality of clock signals in response to receiving a feedback signal, the phase multiplexer configured to generate an output clock signal of a second frequency that can be selected lower and higher than the first frequency; and a selection circuit coupled to the phase multiplexer, the selection circuit comprises a state machine circuit that receives the output clock signal at its input, generates a one-hot signal, and generates the feedback signal that controls the phase multiplexer, the state machine circuit comprising a plurality of flip-flops coupled to each other in a loop configuration such that a data output of each flip-flop is coupled to a data input of a preceding flip-flop.

2. The fractional clock generator according to claim 1, wherein the plurality of clock signals has equidistant phase shifts distributed over a period of the first frequency.

3. The fractional clock generator according to claim 1, wherein the selection circuit is programmable.

4. The fractional clock generator according to claim 1, wherein the state machine circuit is a rotate circuit that generates a one-hot signal.

5. The fractional clock generator according to claim 1, further comprising a control block coupled between the state machine circuit and the phase multiplexer, the control block enables a switching order of clock signals by selecting and or deselecting one or more of the plurality of clock signals.

6. The fractional clock generator according to claim 1, wherein the plurality of flip-flops generates a sequence of output signals that each represent a machine state.

7. The fractional clock generator according to claim 1, wherein the phase angle of a first clock signal is different from the phase angle of a second clock signal.

8. The fractional clock generator according to claim 7, wherein the predetermined sequence of the plurality of clock signals comprises a number of different phase angles that successively increase from the first clock signal to the second clock signal.

9. The fractional clock generator according to claim 8, wherein the number of different phase angles generated by the phase generator is equal to a number of legal states of a state machine circuit.

10. The fractional clock generator according to claim 1, further comprising a divider circuit coupled to the phase multiplexer, the divider circuit divides the second frequency by an integer number and outputs a signal comprising a 50 percent duty cycle.

11. The fractional clock generator according to claim 1, wherein the different phase signals are 90° offset from each other.

12. A method to generate a fractional clock signal, the method comprising:

splitting a phase of an input clock signal having an input frequency to generate phase signals;

generating from the phase signals a plurality of clock signals having the input frequency, each of the plurality of clock signals comprises a phase angle different from at least one other of the plurality of clock signals;

selecting a sequence of the plurality of clock signals in response to receiving a feedback signal;

generating an output clock signal comprising an output frequency that can be selected lower and higher than the input clock signal and an output phase angle; and generating the feedback signal and a one-hot signal using a state machine circuit that receives the output clock signal from a multiplexer, wherein the different phase angles vary the period of the output clock signal with respect to the input clock signal such that the output frequency is different from the input frequency, and wherein the state machine circuit comprises a plurality of flip-flops coupled to each other in a loop configuration such that a data output of each flip-flop is coupled to a data input of a preceding flip-flop.

13. The method according to claim 12, wherein the output frequency of the output clock signal is less than the first frequency if the phase angle of the selected clock signals successively lags, thereby extending the period of the output clock signal with respect to the input clock signal.

14. The method according to claim 12, wherein the frequency of the output clock signal is greater than the first frequency if the phase angle of the selected clock signals successively leads, thereby decreasing the period of the output clock signal with respect to the input clock signal.

15. The method according to claim 12, wherein the state machine generates a sequence of output signals that each represent a machine state.

16. The method according to claim 12, wherein generating the feedback signal is performed in response to detecting a positive or negative edge of at least one edge of the selected clock signals.

17. The method according to claim 12, further comprising dividing the output clock signal by a divisor value to obtain a predetermined duty cycle.

18. The fractional clock generator according to claim 1, further comprising a controller coupled between the state machine and the phase multiplexer, the controller enables the switching order of the clock signals.

19. The fractional clock generator according to claim 1, wherein the state machine is one of a firmware programmed microcontroller, a phase rotator, and a digital state machine whose initial state is set to a logic one representing a selected state while all other states are set to a logic zero.

20. The fractional clock generator according to claim 1, wherein the state machine controls the sequence in which the phase multiplexer selects one of the plurality of clock signals, each clock signal being associated with a state.

* * * * *